US012771582B2

(12) United States Patent
Recio et al.

(10) Patent No.: US 12,771,582 B2
(45) Date of Patent: Oct. 20, 2026

(54) DECODING OF A BIPHASE SIGNAL IN A WIRELINE MODEM

(71) Applicant: Schlumberger Technology Corporation, Sugar Land, TX (US)

(72) Inventors: Adolfo Leon Recio, Clamart (FR); Nalin Weerasinghe, Sagamihara (JP); Hiroshi Nomura, Sagamihara (JP); Robert W. Tennent, Katy, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 114 days.

(21) Appl. No.: 18/931,514

(22) Filed: Oct. 30, 2024

(65) Prior Publication Data

US 2026/0121894 A1 Apr. 30, 2026

(51) Int. Cl.

| | |
|---|---|
| ***H04L 25/49*** | (2006.01) |
| ***E21B 47/12*** | (2012.01) |
| ***H03M 5/12*** | (2006.01) |

(52) U.S. Cl.

CPC .......... *H04L 25/4904* (2013.01); *H03M 5/12* (2013.01); *E21B 47/12* (2013.01)

(58) Field of Classification Search

CPC ........ E21B 47/12; E21B 47/125; E21B 47/26; H03M 5/00; H03M 5/12; H04L 25/4904

See application file for complete search history.

(56) References Cited

U.S. PATENT DOCUMENTS

| | | | | |
|---|---|---|---|---|
| 4,868,569 | A * | 9/1989 | Montgomery | H03M 5/12 375/333 |
| 5,175,507 | A * | 12/1992 | Roither | H04L 25/4904 375/333 |
| 6,125,136 | A | 9/2000 | Jones | |
| 6,630,890 | B1 * | 10/2003 | Endo | E21B 47/12 367/5 |
| 6,873,653 | B1 | 3/2005 | Rezvani | |
| 6,892,339 | B1 | 5/2005 | Polk, Jr. | |
| 6,993,097 | B2 * | 1/2006 | Hammes | H04L 25/03197 375/334 |
| 7,058,118 | B1 | 6/2006 | Horii | |
| 7,787,525 | B1 * | 8/2010 | Clark, Jr. | E21B 47/13 702/6 |
| 9,031,167 | B2 | 5/2015 | Xu | |
| 9,512,716 | B2 | 12/2016 | Liu | |
| 9,982,528 | B2 | 5/2018 | Recio | |
| 2005/0285753 | A1 | 12/2005 | Shah | |
| 2016/0003035 | A1 | 1/2016 | Logan | |
| 2016/0245078 | A1 | 8/2016 | Mahmoud | |

(Continued)

FOREIGN PATENT DOCUMENTS

| | | | |
|---|---|---|---|
| CN | 221503277 | U | 8/2024 |
| EP | 2876256 | A1 | 5/2015 |

*Primary Examiner* — Franklin D Balseca

(74) *Attorney, Agent, or Firm* — Jeffrey D. Frantz

(57) ABSTRACT

The present disclosure provides techniques and apparatus for decoding of a biphase signal in a wireline modem. An example technique involves receiving a biphase modulated signal from a surface acquisition module via a communication link between the downhole telemetry module and the surface acquisition module. A linear modulated-based representation of the biphase modulated signal is generated. The linear modulated-based representation of the biphase modulated signal is processed to obtain data associated with the biphase modulated signal.

20 Claims, 12 Drawing Sheets

(56) References Cited

U.S. PATENT DOCUMENTS

| | | | |
|---|---|---|---|
| 2019/0229767 | A1 | 7/2019 | Olson |
| 2021/0087927 | A1 | 3/2021 | Miller |
| 2021/0238992 | A1 | 8/2021 | Zeng |
| 2024/0368979 | A1 | 11/2024 | Solem |
| 2025/0308376 | A1 | 10/2025 | Maclean |

* cited by examiner

DECODING OF A BIPHASE SIGNAL IN A WIRELINE MODEM

BACKGROUND

Field of the Disclosure

The present disclosure generally relates to wellbore telemetry systems. More specifically, the present disclosure relates to techniques and apparatus for decoding of a biphase signal in a wireline modem.

DESCRIPTION OF RELATED ART

Hydrocarbon fluids, such as oil and natural gas, may be obtained from a subterranean geologic formation, referred to as a reservoir, by drilling a well that penetrates a hydrocarbon-bearing formation. A variety of downhole tools (e.g., wireline instruments, logging-while-drilling instruments, etc.) may be used in various areas of oil and natural gas services. In some cases, downhole tools may be used in a well for surveying, drilling, and production of hydrocarbons. For example, data regarding surrounding earth formations may be collected by the downhole tools. The downhole tools may analyze the collected data and transmit the collected data and the results of the analysis to the surface where further analysis is performed.

Although wellbore telemetry systems have made technological advancements over many years, there is a continuous desire to improve the technical performance of wellbore telemetry systems, including, for example: improving speed and data carrying capacity of communications, improving efficiency of the use of communication mediums, improving reliability of communications, and the like. Consequently, there exists a need for further improvements in wellbore telemetry systems.

SUMMARY

One embodiment of the present disclosure described herein is a method performed by a downhole telemetry. The method includes receiving a biphase modulated signal from a surface acquisition module via a communication link between the downhole telemetry module and the surface acquisition module. The method also includes generating a linear modulated-based representation of the biphase modulated signal. The method further includes processing the linear modulated-based representation of the biphase modulated signal to obtain data associated with the biphase modulated signal.

Another embodiment of the present disclosure described herein is a downhole telemetry module. The downhole telemetry module includes one or more memories collectively storing instructions, and one or more processors communicatively coupled to the one or more memories. The one or more processors are collectively configured to execute the instructions to cause the downhole telemetry module to: receive a biphase modulated signal from a surface acquisition module via a communication link between the downhole telemetry module and the surface acquisition module; generate a linear modulated-based representation of the biphase modulated signal; and process the linear modulated-based representation of the biphase modulated signal to obtain data associated with the biphase modulated signal.

Another embodiment of the present disclosure is a non-transitory computer-readable storage medium. The non-transitory computer-readable storage medium includes computer-executable code, which when executed by one or more processors of a downhole telemetry module, perform an operation. The operation includes receiving a biphase modulated signal from a surface acquisition module via a communication link between the downhole telemetry module and the surface acquisition module. The operation also includes generating a linear modulated-based representation of the biphase modulated signal. The operation further includes processing the linear modulated-based representation of the biphase modulated signal to obtain data associated with the biphase modulated signal.

The following description and the appended figures set forth certain features for purposes of illustration.

BRIEF DESCRIPTION OF DRAWINGS

Various embodiments in accordance with the present disclosure will be described with reference to the drawings, where like designations denote like elements. Note that the appended drawings illustrate typical embodiments and are therefore not to be considered limiting; other equally effective embodiments are contemplated.

DETAILED DESCRIPTION

Figure 1:
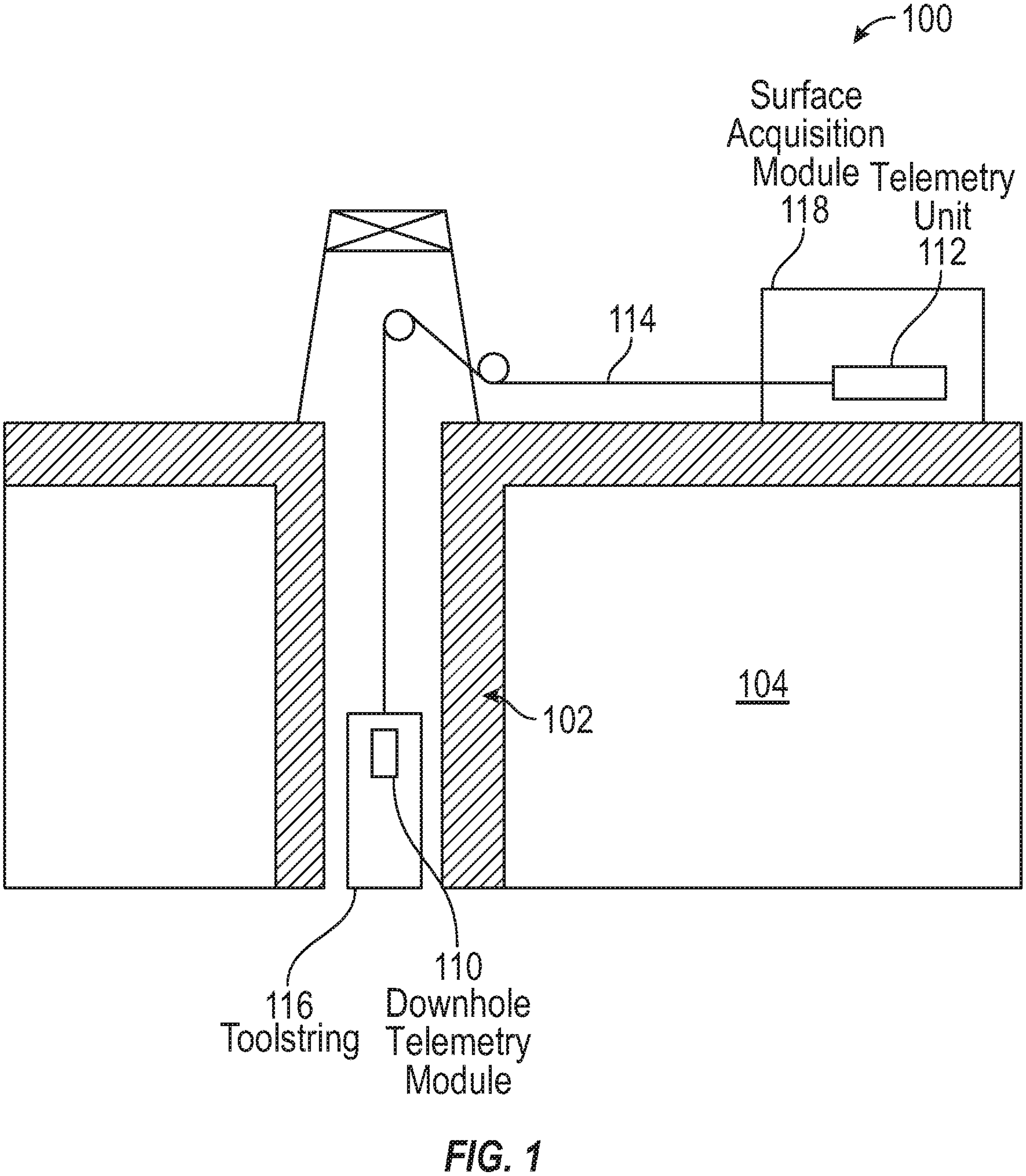
FIG. 1 is a schematic diagram of an example system, according to certain embodiments.

Certain wireline telemetry systems may use "legacy" physical layer (PHY) communication protocols for uplink and downlink communications, such as quadrature amplitude modulation (QAM) for uplink and biphase protocol (also referred to as biphase encoding) for downlink. In such wireless telemetry systems, receivers may decode biphase signals using time counts between zero crossings. However, this approach to decoding biphase signals may be sensitive to noise and interference, and therefore, may have low reliability in wireline communication channels.

For example, conventional wireline telemetry systems typically use the biphase protocol for downlink communications under an assumption that there will be low distortion of the biphase signal. However, in real-world scenarios, communication channels, such as monocables and coaxial cables introduce large signal distortions in the form of attenuation and group delay. To mitigate these effects, conventional wireline telemetry systems typically use fixed compromise pre-equalizers on the transmitter. At the receive side, conventional wireline telemetry systems may implement receiver-side adaptive equalizers that can infer the response of the communication channel and adapt accordingly.

However, in certain cases, biphase signals may not be suitable for (or adapted to) the aforementioned linear equalization techniques implemented in receiver-side adaptive equalizers. Consequently, receivers in wireline telemetry systems that implement such linear equalization techniques when decoding biphase signals may have reduced performance in terms of low signal-to-noise ratio (SNR), high bit error rate (BER), and low receiver sensitivity, as illustrative examples.

The present disclosure provides techniques, methods, systems, apparatus, and computer readable media for implementing a communications receiver that maximizes (or at least improves) the reliability of decoding a biphase signal in a transmission that is affected by channel distortion and noise, among other effects. The techniques described herein for decoding a biphase signal may provide various advantages. For example, in certain embodiments, the biphase decoding techniques described herein may provide signal equalization, robust frame detection, accurate symbol timing tracking, and accurate signal phase tracking, as illustrative examples. The symbol timing and signal phase tracking algorithms described herein, for example, may allow for the reliable decoding of the biphase signal even when clock oscillators on both ends of the communication links (e.g., transmitter modem and receiver modem) differ in frequency.

The following description includes embodiments of the best mode presently contemplated for practicing the described implementations. This description is not to be taken in a limiting sense, but rather is made merely for the purpose of describing the general principles of the implementations. The scope of the described implementations should be ascertained with reference to the issued claims.

Although the terms "first," "second," "third," etc., may be used herein to describe various elements, components, regions, layers and/or sections, these elements, components, regions, layers and/or sections should not be limited by these terms. These terms may be only used to distinguish one element, component, region, layer or section from another element, component, region, layer, or section. Terms such as "first," "second," and other numerical terms, when used herein, do not imply a sequence or order unless clearly indicated by the context. Thus, a first element, component, region, layer, or section discussed herein could be termed a second element, component, region, layer, or section without departing from the teachings of the example embodiments.

As used herein, a hyphenated form of a reference numeral refers to a specific instance of an element and the unhyphenated form of the reference numeral refers to the collective element. Thus, for example, device "12-1" refers to an instance of a device class, which may be referred to collectively as devices "12" and any one of which may be referred to generically as a device "12". As used herein, the terms "carrier," "subcarrier," "frequency channel," "channel unit," "channel," and "tone" may be used interchangeably to refer to a frequency unit (or unit of frequency).

Example System for Decoding of a Biphase Signal in a Wireline Modem

FIG. 1 is a schematic diagram of at least a portion of an example implementation of a wellsite system 100 that can be configured with a receiver that provides reliable decoding of biphase signals, according to various embodiments. In FIG. 1, an example wireline logging operation is illustrated with respect to the wellsite system 100. The wellsite system 100 is deployed in a wellbore 102 traversing a subsurface formation 104. A downhole telemetry module 110 (also referred to as a downhole telemetry equipment, a downhole telemetry system, or a downhole telemetry cartridge) is connected to a toolstring 116. In a well-logging operation, one or more tools may be connected to, included within, or otherwise coupled to the toolstring 116. The tools of the toolstring 116 may communicate with downhole telemetry circuits of the downhole telemetry module 110 via a bi-directional electrical interface.

In certain embodiments, the tool(s) of the toolstring 116 may be connected to the downhole telemetry module 110 over a common data bus. In certain other embodiments, each tool of the toolstring 116 may be individually, directly connected to the downhole telemetry module 110. In one embodiment, the downhole telemetry module 110 may be a separate unit, which is mechanically and electrically connected to the tools in the toolstring 116. In one embodiment, the downhole telemetry module 110 may be integrated into a housing of one of the tools of the toolstring 116.

The downhole telemetry module 110 is operatively coupled to the wireline cable 114. The tools of the toolstring 116, including the downhole telemetry module 110, may be lowered into the wellbore 102 on the wireline cable 114. The wireline cable 114 may be a monocable, coaxial cable, IFC power cable, slickline, or a multi-conductor cable, such as a heptacable.

A surface acquisition module 118 is located at the surface end of the wireline cable 114. The surface acquisition module 118 includes or couples to a telemetry unit 112 (also referred to as a telemetry module). The surface acquisition module 118 may provide control of the components in the toolstring 116 and process and store the data acquired downhole. The surface acquisition module 118 may communicate with the telemetry unit 112 via a bi-directional electrical interface.

The telemetry unit 112 may modulate downlink data (e.g., commands) from the surface acquisition module 118 for transmission via the wireline cable 114 to the toolstring 116, and demodulate uplink data received via the wireline cable 114 from the toolstring 116 for processing and storage by the surface acquisition module 118. The telemetry unit 112 may use a telemetry protocol for uplink and downlink communications with the downhole telemetry module 110. In certain embodiments, the telemetry unit 112 uses a biphase protocol for downlink communications with the downhole telemetry module 110. In such embodiments, the telemetry unit 112 may include a transmitter configured to generate (or encode) biphase signals for transmission to the downhole telemetry module 110. Note, however, that the telemetry unit 112 may be configured to support other telemetry protocols.

The downhole telemetry module 110 includes circuitry to modulate uplink data from the tools of the toolstring 116 for transmission via the wireline cable 114 to the surface acquisition module 118. The downhole telemetry module 110 also includes circuitry to demodulate downlink commands or data from the surface acquisition module 118 for the tools of the toolstring 116. The downhole telemetry module 110 may use a telemetry protocol for uplink and downlink communications with the telemetry unit 112 of the surface acquisition module 118. The downhole telemetry module 110 may support one or more telemetry protocols for communications with the surface acquisition module 118. In certain embodiments, the downhole telemetry module 110 includes a receiver configured to decode biphase signals using one or more techniques described herein.

Figure 2:
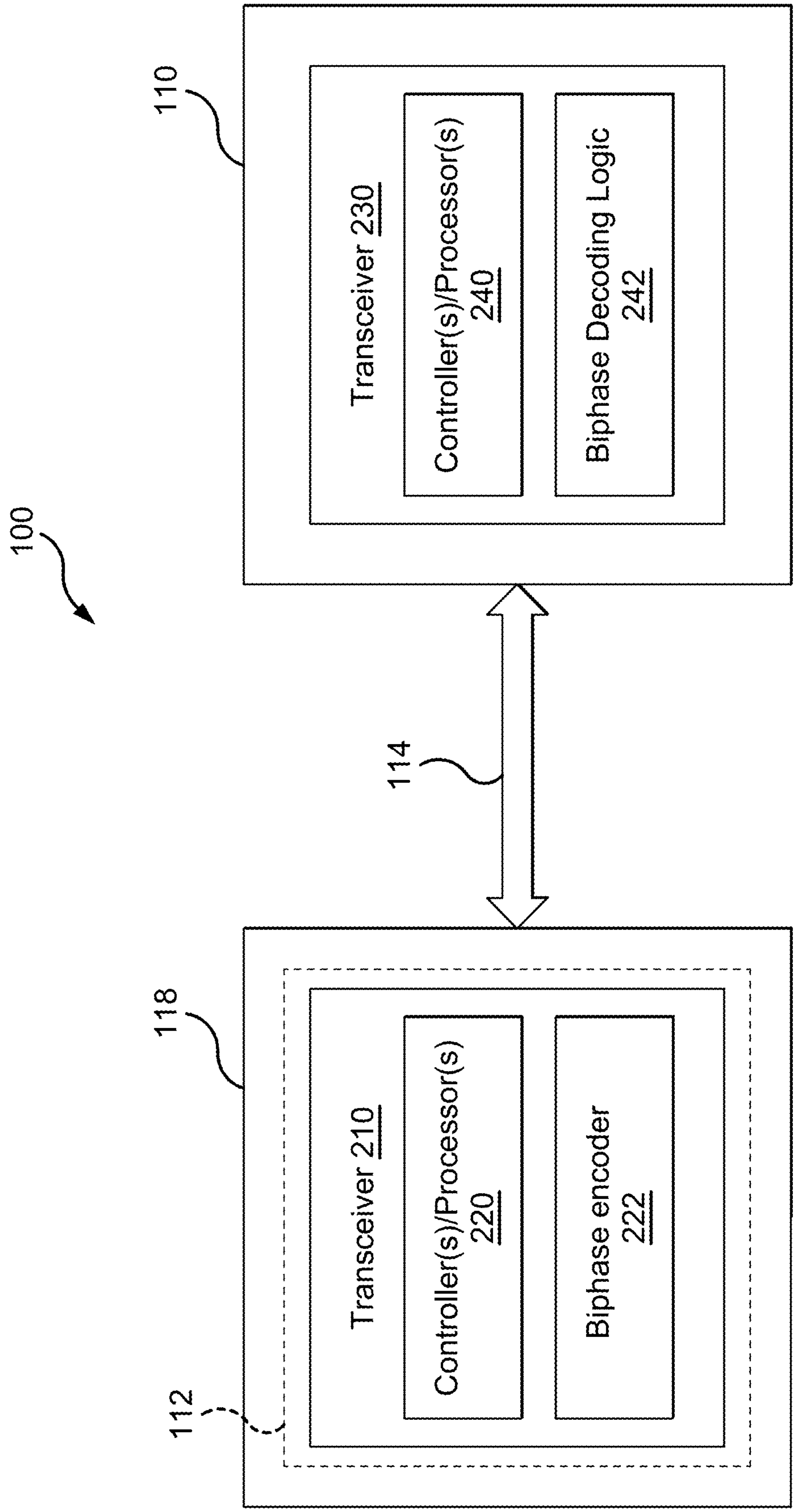
FIG. 2 further illustrates the surface acquisition module and the downhole telemetry module depicted in FIG. 1, according to certain embodiments.

FIG. 2 further illustrates the surface acquisition module 118 and the downhole telemetry module 110 depicted in FIG. 1, according to various embodiments. Generally, the surface acquisition module 118 includes a transceiver 210 (e.g., transmitter and receiver) (also referred to as a modem), which enables transmission of data to the downhole telemetry module 110 (e.g., downlink direction) via wireline cable 114 and reception of data from the downhole telemetry module 110 (e.g., uplink direction) via wireline cable 114. In certain embodiments, the transceiver 210 is included within the telemetry unit 112. The transceiver 210 includes one or more controller(s)/processor(s) 220 configured to implement various functions described herein. The transceiver 210 also includes a biphase encoder 222, which is configured to perform biphase encoding. The biphase encoder 222 may include hardware, software, or combinations thereof. Although not shown in FIG. 2, the transceiver 210 may include other components, such as modulators, demodulators, encoders, decoders, equalizers, and amplifiers, among others, to enable communication with transceiver 230. Additionally, while FIG. 2 depicts the transceiver 210 within the telemetry unit 112, in certain embodiments, the transceiver 210 may be external to the telemetry unit 112.

As also shown, downhole telemetry module 110 includes a transceiver 230 (e.g., transmitter and receiver) (also referred to as a modem), which enables transmission of data to the surface acquisition module 118 (e.g., uplink direction) via wireline cable 114 and reception of data from the surface acquisition module 118 (e.g., downlink direction) via wireline cable 114. The transceiver 230 includes one or more controller(s)/processor(s) 240 configured to implement various functions described herein. The transceiver 230 also includes biphase decoding logic 242 (e.g., software) for implementing one or more techniques described herein for decoding biphase signals. The biphase decoding logic 242 may be executed by the controller(s)/processors(s) 240. Although not shown in FIG. 2, the transceiver 230 may include other components, such as modulators, demodulators, encoders, decoders, equalizers, and amplifiers, among others, to enable communication with transceiver 210.

As noted, in some cases, the surface acquisition module 118 may use a biphase protocol for downlink transmission. In such cases, the surface acquisition module 118 may use the biphase encoder 222 to generate (or encode) biphase signals for downlink transmission to the downhole telemetry module 110. In certain cases, the surface acquisition module 118 may support a telemetry system that uses multiple biphase signal waveforms for the implementation of the downlink. These biphase signal waveforms can be used for transmission of symbols (e.g., −0, +0, −1, +1) at various bit rates, such as 70, 54, 35, 27, 17.5, and 13.15 kilobits per second (kbps), as illustrative examples.

Figure 3A:
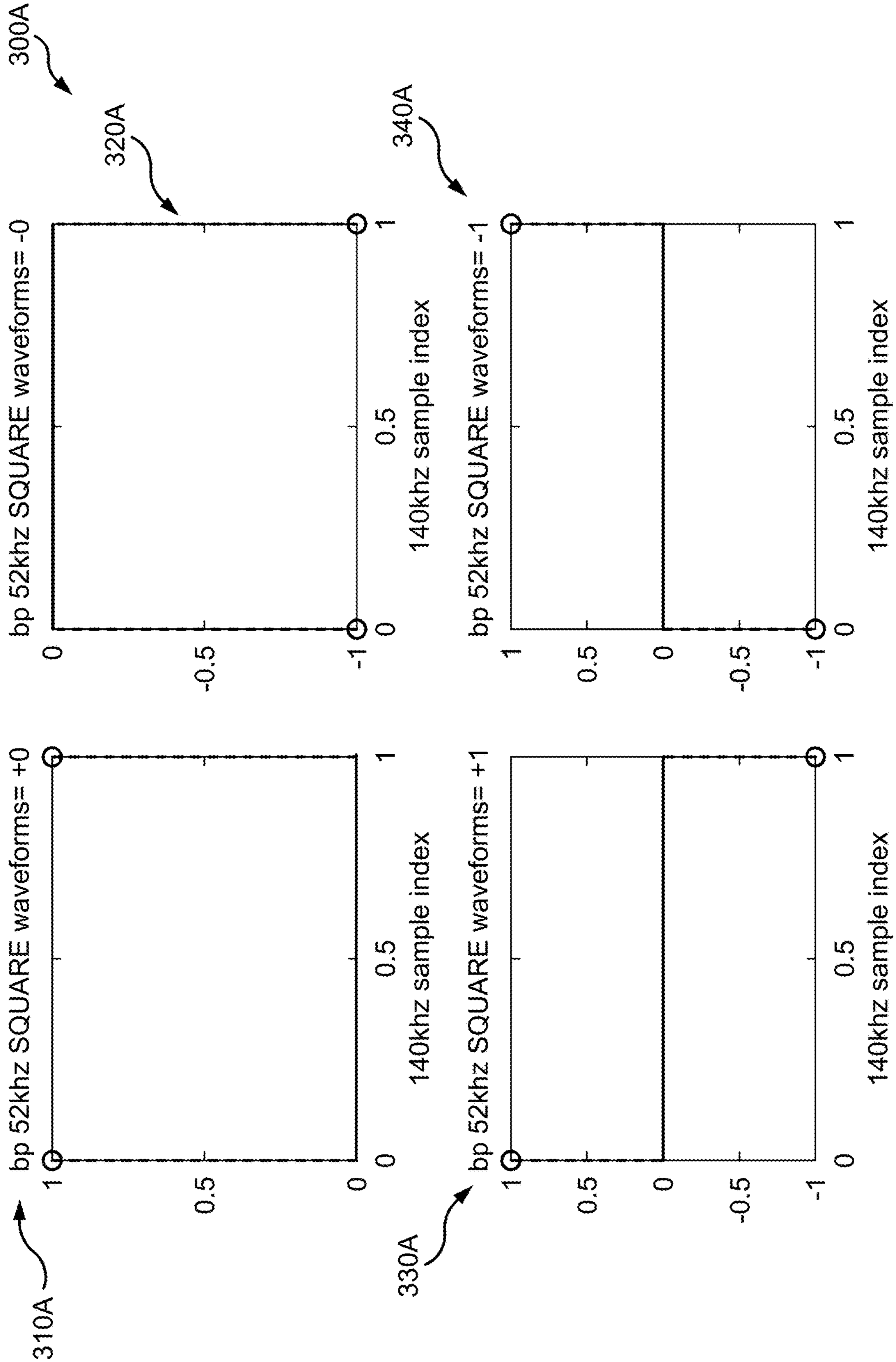
FIGS. 3A-3C illustrate example biphase signal waveforms, according to certain embodiments.
Figure 3B:
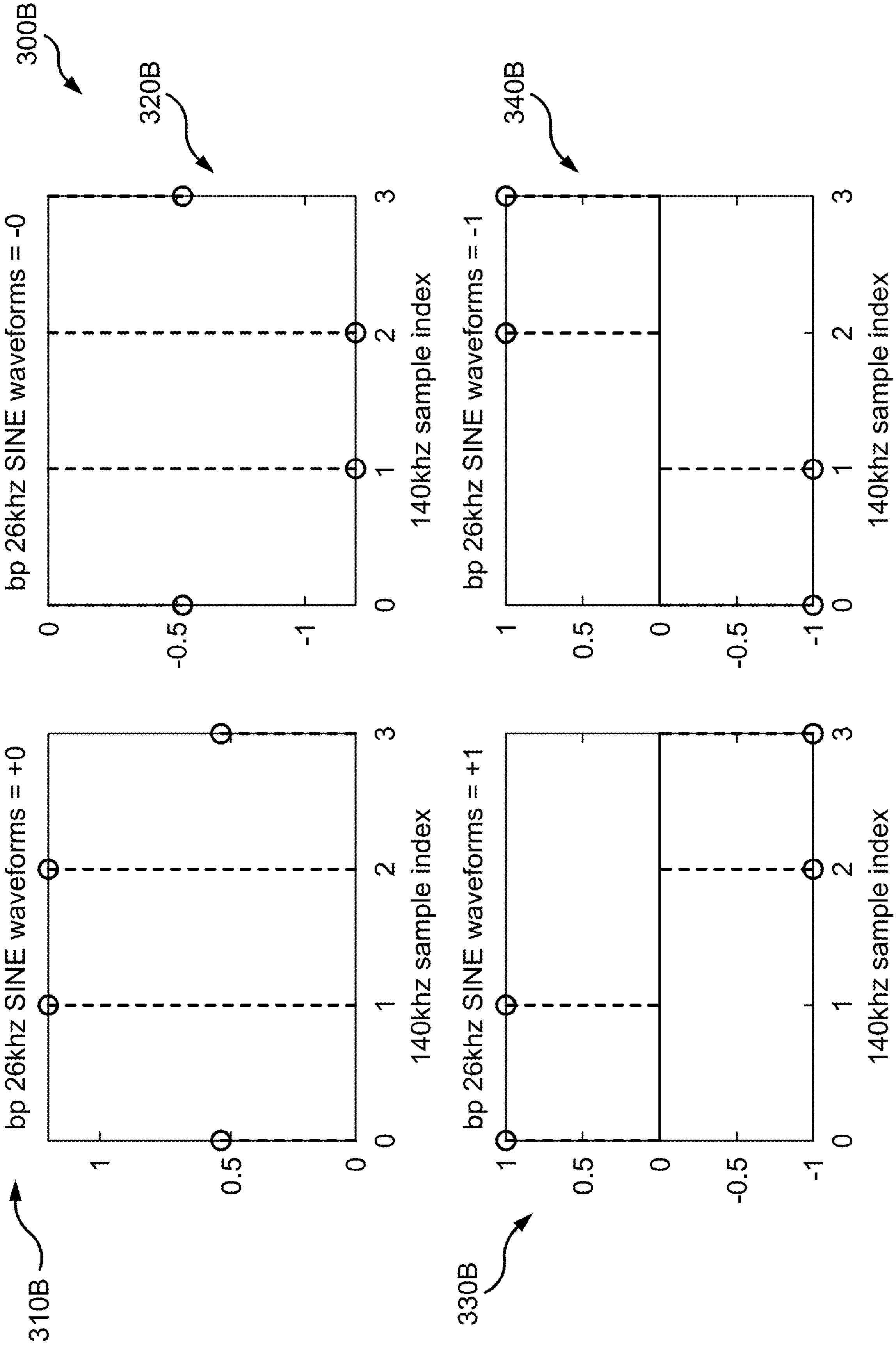
Figure 3C:
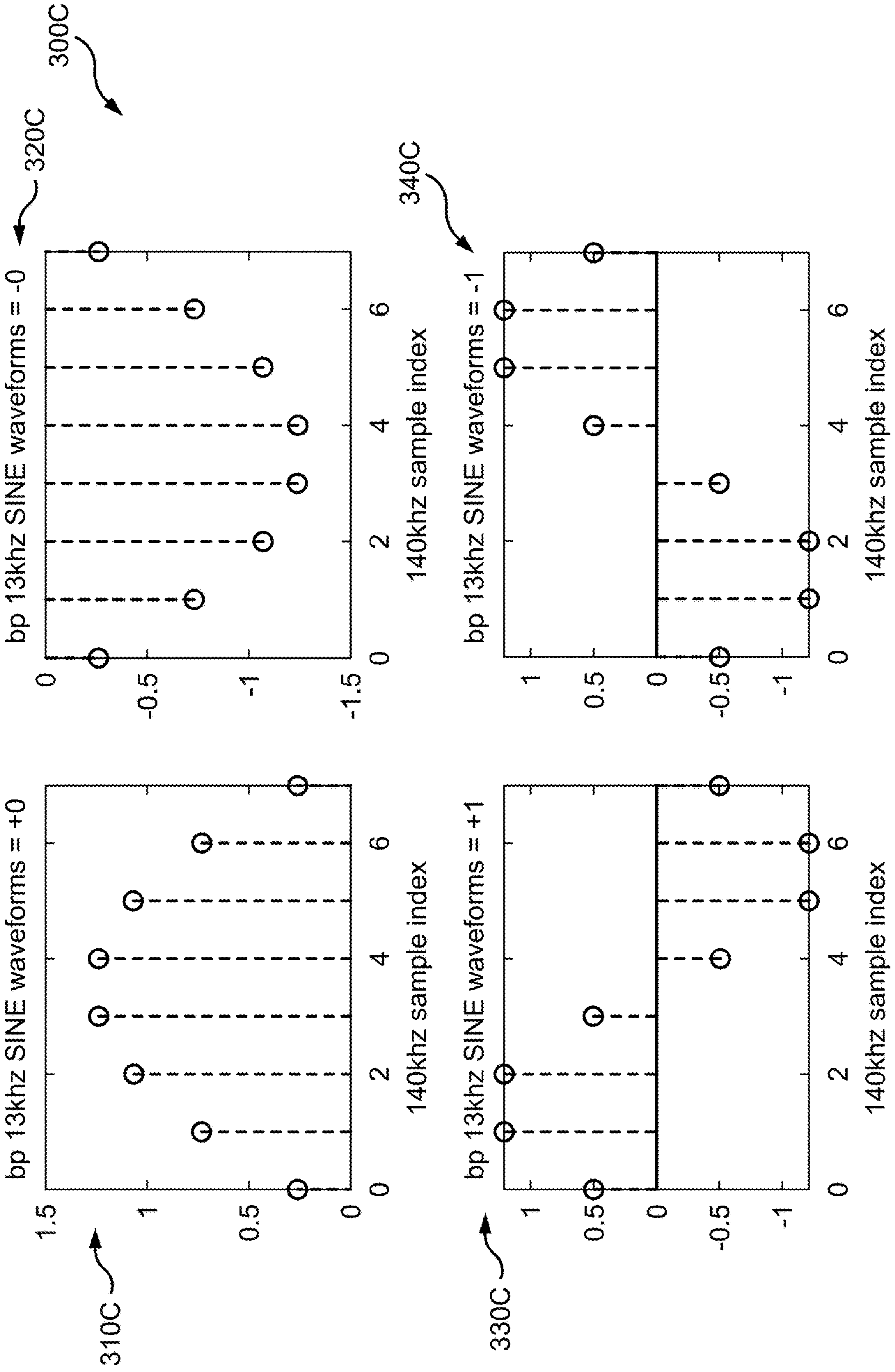

By way of example, FIGS. 3A-3C illustrate example biphase signal waveforms 300A-300C, respectively, that can be used for downlink transmission, according to various embodiments. In particular, FIG. 3A depicts a set of biphase square waveforms 300A at 52 kilohertz (kHz) that includes a waveform 310A used to represent the symbol "+0", a waveform 320A used to represent the symbol "−0", a waveform 330A used to represent the symbol "+1", and a waveform 340A used to represent the symbol "−1." FIG. 3B depicts a set of biphase sine waveforms 300B at 26 kHz that includes a waveform 310B used to represent the symbol "+0", a waveform 320B used to represent the symbol "−0", a waveform 330B used to represent the symbol "+1", and a waveform 340B used to represent the symbol "−1." FIG. 3C depicts a set of biphase sine waveforms at 13 kHz that includes a waveform 310C used to represent the symbol "+0", a waveform 320C used to represent the symbol "−0", a waveform 330C used to represent the symbol "+1", and a waveform 340C used to represent the symbol "−1."

In general, biphase modulation uses a low frequency to represent the symbol "0" and double this frequency to represent the symbol "1," and records the phase of the previous symbol, to choose the appropriate representations of the "0" or "1" symbol that prevents phase non-continuities. This modulation approach may also be referred to as continuous-phase frequency shift keying (CPFSK).

The bit "0" can be represented by (i) symbol "+0"=sin($\pi t/T_s$) or (ii) symbol "−0"=−sin($\pi t/T_s$). The bit "1" can be represented by symbol "+1"=sin($2\pi t/T_s$) or symbol "−1"=−sin($2\pi t/T_s$). $T_s$ is the duration of a symbol. Thus, in biphase modulation, four different signals may be used to represent the transmitted bits, with the bit information contained in the frequency of the signal, and extra information encoded in the sign to keep the phase continuous. The four signals $$(s_0^+(t),\ s_0^-(t),\ s_1^+(t),\ s_1^-(t))$$

can be represented using the following:

$$s_0^+(t) = +\sin\left(\frac{\pi t}{T_s}\right) \tag{1}$$

$$s_0^-(t) = -\sin\left(\frac{\pi t}{T_s}\right) \tag{2}$$

$$s_1^+(t) = +\sin\left(\frac{2\pi t}{T_s}\right) \tag{3}$$

$$s_1^-(t) = -\sin\left(\frac{2\pi t}{T_s}\right) \tag{4}$$

Figure 4:
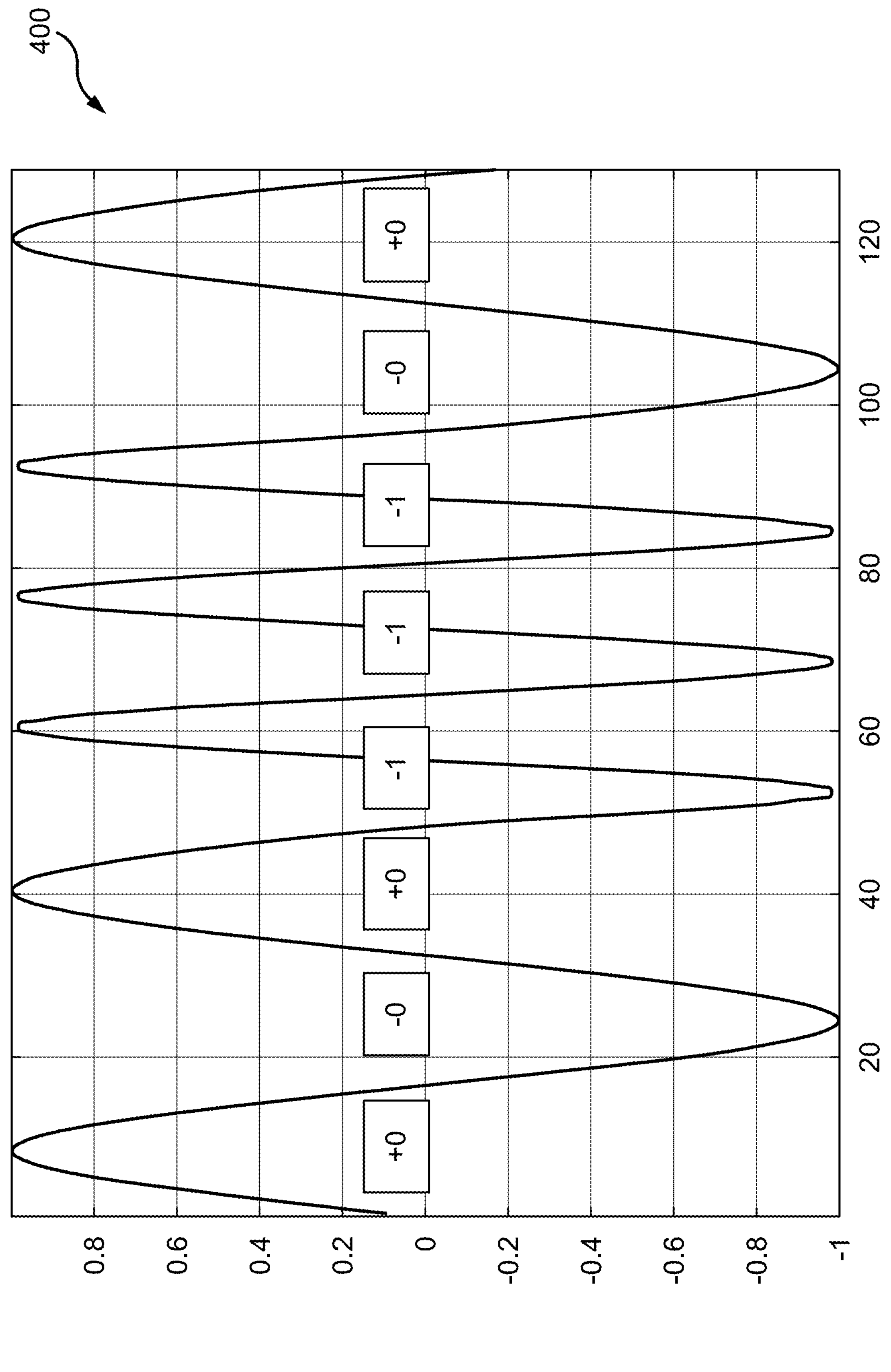
FIG. 4 illustrates an example biphase signal, according to certain embodiments.

When encoding a biphase signal, the choice of polarity of the next symbol may depend on the final value of the previous symbol. After the transmission of a "one," no polarity change occurs, as the signal is a full cycle of a sine wave. However, after the transmission of a "zero," the polarity may have to be inverted, since half a cycle was transmitted. By way of example, FIG. 4 illustrates an example of a biphase signal 400 for a data sequence [0 0 0 1 1 1 0 0], according to various embodiments. As shown in FIG. 4, the transmission of a "0" has the effect of inverting the phase of the following symbols. Thus, there is extra information in the sign of the symbol, which can be used to enhance the performance of the receiver.

As noted, one challenge with decoding biphase signals in receivers that use linear equalization techniques is that the biphase signals may not be suitable for such linear equalization techniques. Thus, using linear equalization techniques when decoding biphase signals can impact receiver performance in terms of low SNR, high BER, and low receiver sensitivity, as illustrative examples.

To address this, the present disclosure provides improved techniques for decoding biphase signals in receivers that implement linear equalization techniques. In certain embodiments described herein, a receiver (e.g., transceiver 230) is configured to convert a biphase modulated signal into a linear modulated-based signal before applying linear equalization techniques. For example, the transceiver 230 may use the biphase decoding logic 242 to convert (or translate) the biphase modulated signal into a linear modulation type, such as quadrature phase shift keying (QPSK), as an illustrative example.

In certain embodiments, the biphase decoding logic 242 may use a mathematical translation to interpret the biphase modulation signal into a linear modulation type. As an illustrative example, biphase modulation can be interpreted as offset QPSK (OQPSK) using trigonometric identities. The formulation of biphase modulation as OQPSK may allow for performing robust frame detection, as well as linear equalization. To convert a biphase signal into a OQPSK signal, the biphase decoding logic 242 may define the carrier frequency ($f_c$) using Equation (5) and define the frequency of the sinusoidal ($f_s$) that will represent the baseband shape of the symbol using Equation (6):

$$f_c = \frac{3}{4T_s} \quad (5)$$

$$f_s = \frac{1}{4T_s} \quad (6)$$

Given $f_c$ and $f_s$, the four signals $$(s_0^+(t), s_0^-(t), s_1^+(t), s_1^-(t))$$

can be represented as combinations of the carrier and the baseband shape, e.g., according to the following:

$$s_0^+(t) = +\sin\left(\frac{\pi t}{T_s}\right) = +\sin(2\pi(f_c - f_s)t) = +\sin(2\pi f_c t)\cos(2\pi f_s t) - \cos(2\pi f_c t)\sin(2\pi f_s t) \quad (7)$$

$$s_0^-(t) = -\sin\left(\frac{\pi t}{T_s}\right) = -\sin(2\pi(f_c - f_s)t) = -\sin(2\pi f_c t)\cos(2\pi f_s t) + \cos(2\pi f_c t)\sin(2\pi f_s t) \quad (8)$$

$$s_1^+(t) = +\sin\left(\frac{2\pi t}{T_s}\right) = +\sin(2\pi(f_c + f_s)t) = +\sin(2\pi f_c t)\cos(2\pi f_s t) + \cos(2\pi f_c t)\sin(2\pi f_s t) \quad (9)$$

$$s_1^-(t) = -\sin\left(\frac{2\pi t}{T_s}\right) = -\sin(2\pi(f_c + f_s)t) = -\sin(2\pi f_c t)\cos(2\pi f_s t) - \cos(2\pi f_c t)\sin(2\pi f_s t) \quad (10)$$

Some challenges in the implementation of the OQPSK representation may be due to the carrier frequency not being a multiple of $1/T_s$, causing the baseband phase to shift by 270 degrees (°) after the transmission of a bit. Additionally, the baseband shape of the symbol, determined by $f_s$, is a half-sine wave that runs over the duration of two symbols. Consequently, to preserve continuity, the available options for the next symbol may be limited.

By way of example, in Equations (7)-(10), if symbol $$s_0^+(t)$$

is transmitted in the time interval $[0, T_s]$, the term $\sin(2\pi f_s t)$ ends at the peak of the sinusoidal. Therefore, $$s_0^+(t)$$

may be followed in the interval $[T_s, 2\,T_s]$ by a signal that preserves continuity $$(s_0^-(t) \text{ or } s_1^-(t)).$$

Figure 5:
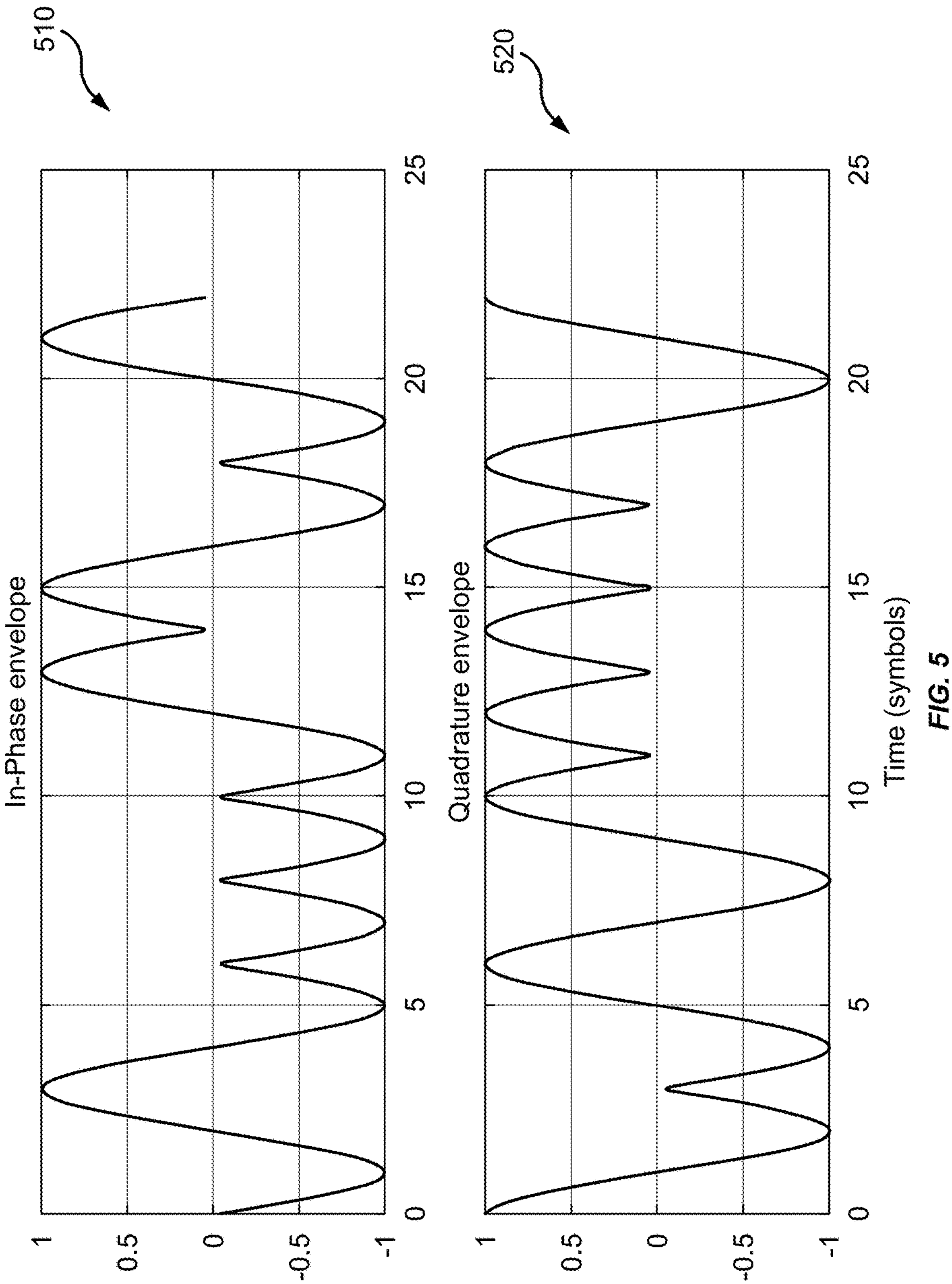
FIG. 5 depicts example in-phase and baseband signal for a offset quadrature phase shift keying (OQPSK) representation of a biphase signal, according to certain embodiments.

The same is true at each interval, such that the next waveform may be a combination of a first term assuring continuity of the sinusoidal shape and a second term conveying the data bit. In this manner, a biphase signal can be represented as an offset modulation (e.g., OQPSK). Additionally, a specific encoding of the data bit into the polarities of the sinusoidal-shaped offset symbols may be performed. FIG. 5 depicts an example in-phase (I) baseband signal 510 and quadrature (Q) baseband signal 520 for a OQPSK baseband representation of a biphase signal, according to various embodiments.

Figure 6:
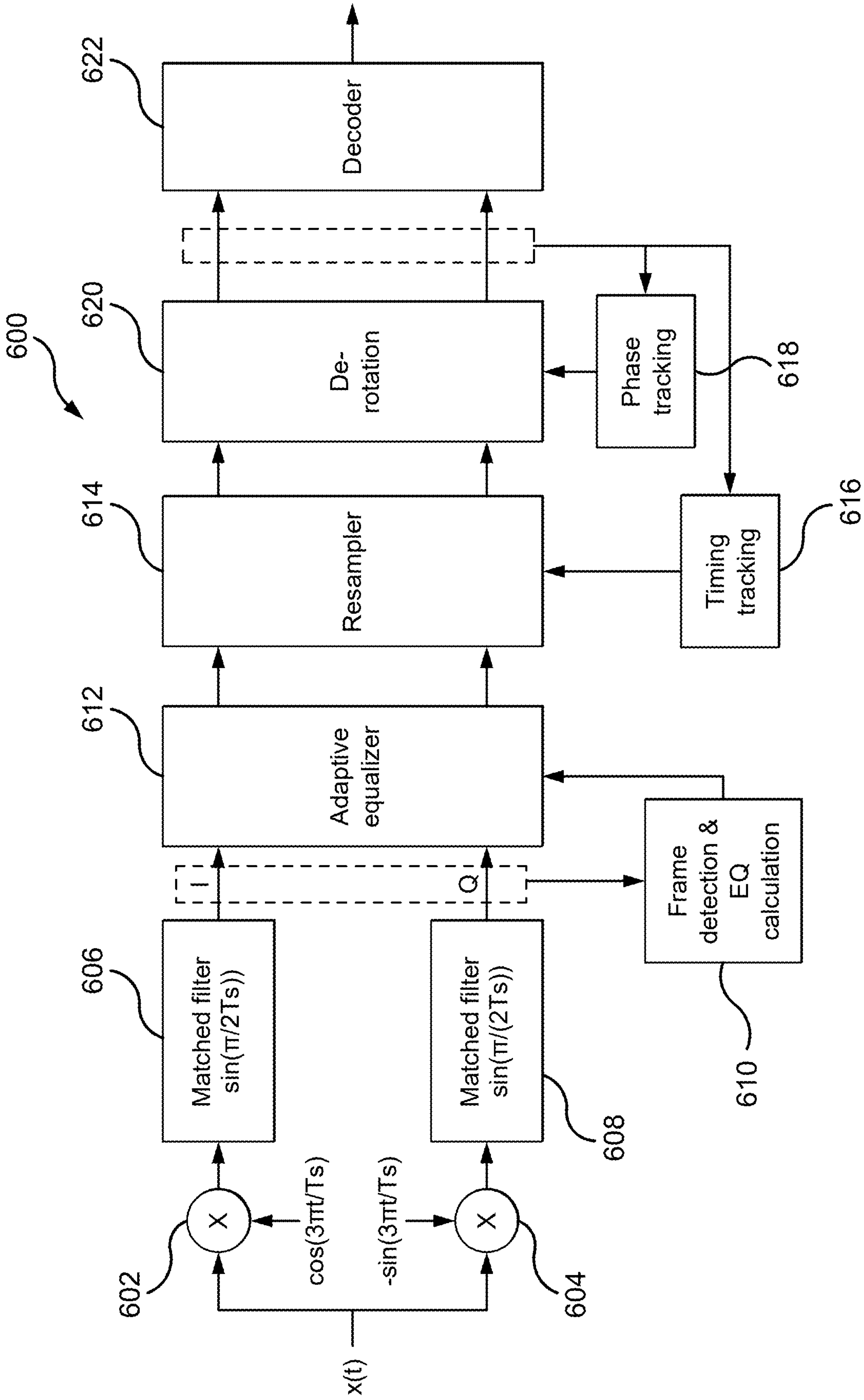
FIG. 6 is a block diagram of at least a portion of a receiver, according to certain embodiments.

FIG. 6 is a block diagram of at least a portion of a receiver 600, according to various embodiments. The receiver 600 may be implemented as part of the transceiver 230 of FIG. 2. As shown, the receiver 600 includes, without limitation, mixers 602 and 604, matched filters 606 and 608, a frame detection component 610, an adaptive equalizer 612, a resampler 614, a timing tracking component 616, a phase tracking component 618, a de-rotation component 620, and a decoder 622. The controller(s)/processor(s) 240 of FIG. 2 may direct the operation of the receiver 600 (including one or more components thereof). The controller(s)/processor(s) 240 may be a processor, a digital signal processor (DSP), an application-specific integrated circuit (ASIC), a field programmable gate array (FPGA) or other programmable logic device (PLD), discrete gate or transistor logic, discrete hardware components, or any combination thereof. A memory (not shown) may store data and/or program codes for operating the receiver 600.

In the operation of the receiver 600, the received samples of a biphase signal may be interpreted (via biphase decoding logic 242) using a OQPSK representation x(t) using Equations (5)-(10). The signal x(t) is input into mixers 602 and 604. Mixer 602 mixes the signal x(t) with a receive local oscillator (LO) signal (e.g., $\cos(3\pi t/T_s)$) to convert the signal x(t) to a different baseband frequency. Similarly, mixer 604 mixes the signal x(t) with another receive LO signal (e.g., $-\sin(3\pi t/T_s)$) to convert the signal x(t) to a different baseband frequency. The signals output from mixers 602 and 604 may be matched filtered using matched filters 606 and 608, respectively, to produce I and Q signals.

In certain embodiments, the frame detection component 610 performs frame detection (or frame synchronization) to determine the start of a data packet (e.g., for burst transmission) or of a frame marker (e.g., for continuous transmission). The frame detection component 610 may use any suitable cross-correlation based technique to perform frame detection.

In certain embodiments, the adaptive equalizer 612 is configured to perform adaptive equalization to eliminate (or at least reduce) distortions of the biphase signal introduced in the communication channel (e.g., wireline cable 114) and recover the correct symbols of the received signal. In certain embodiments, the adaptive equalizer 612 may be trained on information (e.g., data packet start, frame marker, etc.) output from the frame detection component 610. The adaptive equalizer 612 can use any suitable equalization algorithm, such as recursive least squares (RLS) or least means squares (LMS). Note, due to interactions with the timing and symbol tracking loops, the adaptive equalizer 612 may not be adapted during data decoding.

Figure 7:
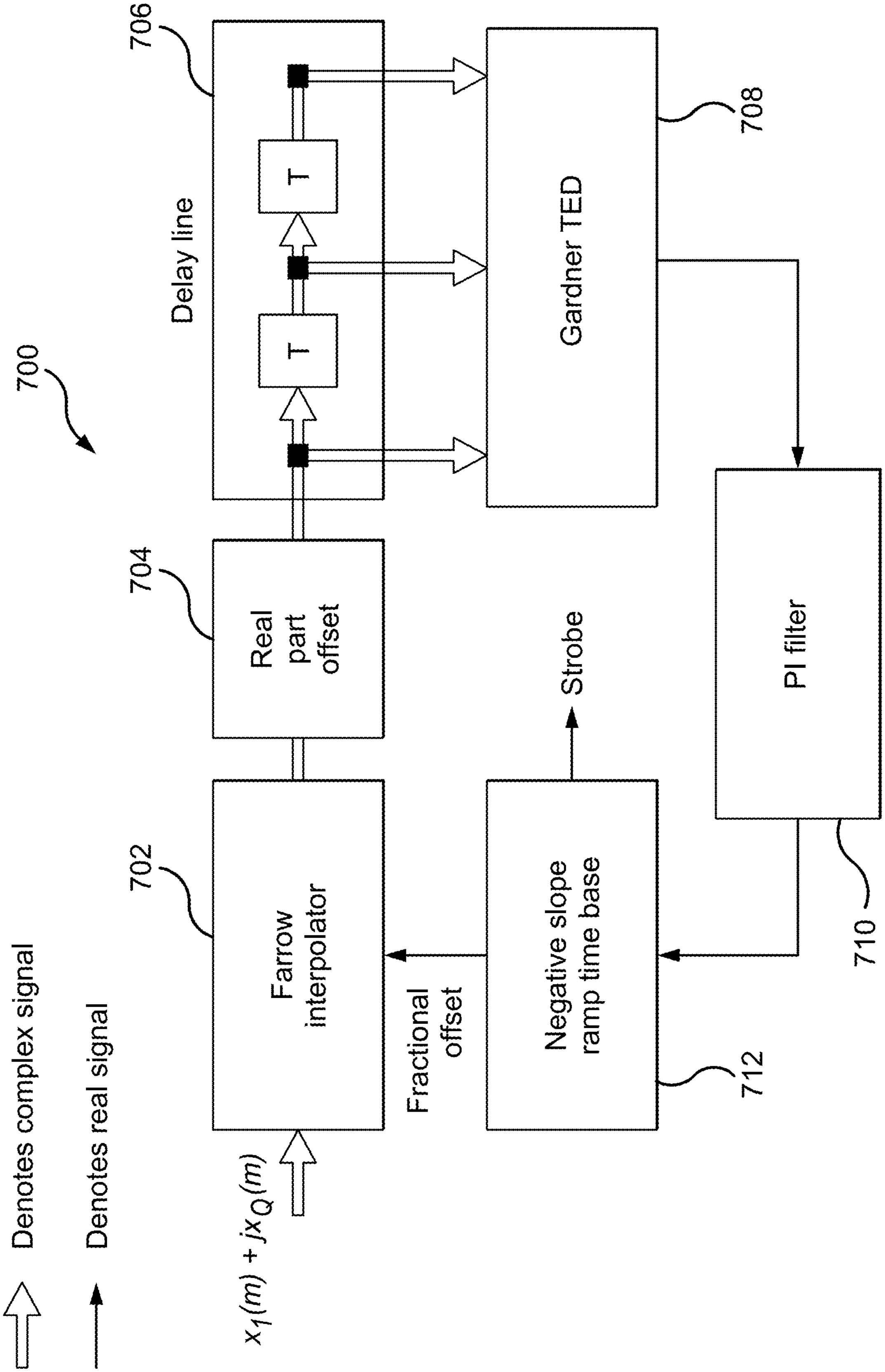
FIG. 7 is a block diagram of an example tracking loop for performing symbol timing synchronization, according to certain embodiments.

In certain embodiments, the timing tracking component 616 is configured to perform symbol timing synchronization to correct the symbol timing clock skew between the transmitter and receiver for OQPSK modulation schemes. In certain embodiments, the timing tracking component 616 performs symbol timing synchronization using a variable phase interpolator (VPI) (or Farrow filter) (e.g., resampler 614). By way of example, FIG. 7 is a block diagram of an example tracking loop 700 for performing symbol timing synchronization, according to various embodiments. The tracking loop 700 includes, without limitation, a Farrow interpolator 702 (e.g., VPI or Farrow filter), a delay line 706, a Gardner timing error detector (TED) 708, (also known as a zero-crossing timing error detector), a proportional-integral (PI) filter 710. In the tracking loop 700, the Farrow interpolator 702 receives a complex signal (e.g., $x_I(m)+jx_Q(m)$) and uses a polynomial of order 2 to achieve appropriate interpolated values (e.g., using a Lagrange polynomial calculation). For example, the Farrow interpolator 702 estimates the value of the signal at a fractional time between samples. The Lagrange polynomial calculation may provide a low complexity implementation of polynomial fitting and polynomial evaluation. The second order implementation may be represented using the following:

$$x(m-1+r)=ar^2+br+c \quad (11)$$

$$a=0.5x(m)-x(m-1)+0.5x(m-2) \quad (12)$$

$$b=0.5x(m)-0.5x(m-2) \quad (13)$$

$$c=x(m-1) \quad (14)$$

where r represents the fractional offset between samples m.

The real part offset 704 outputs a delayed real component of the signal and imaginary component of the signal (e.g., $y_{offset}$). The delay line 706 obtains $y_{offset}$ from the real part offset 704 and provides input samples to the Gardner TED 708. The Gardner TED 708 provides an estimate of the timing error, which is used to update the PI filter 710 (e.g., closed loop PI controller) of the negative slope ramp time base 712. The PI filter 710 provides tracking of the phase by minimizing the error between $y_{offset}$ and the outputs of a slicer $s[n]=\text{sign}(\text{real}(y_{Offset}[n]))+j\ \text{sign}(\text{imag}(y_{Offset}[n]))$, where the sign(x) function returns 1 if x is positive, and −1 if x is negative.

Figure 8:
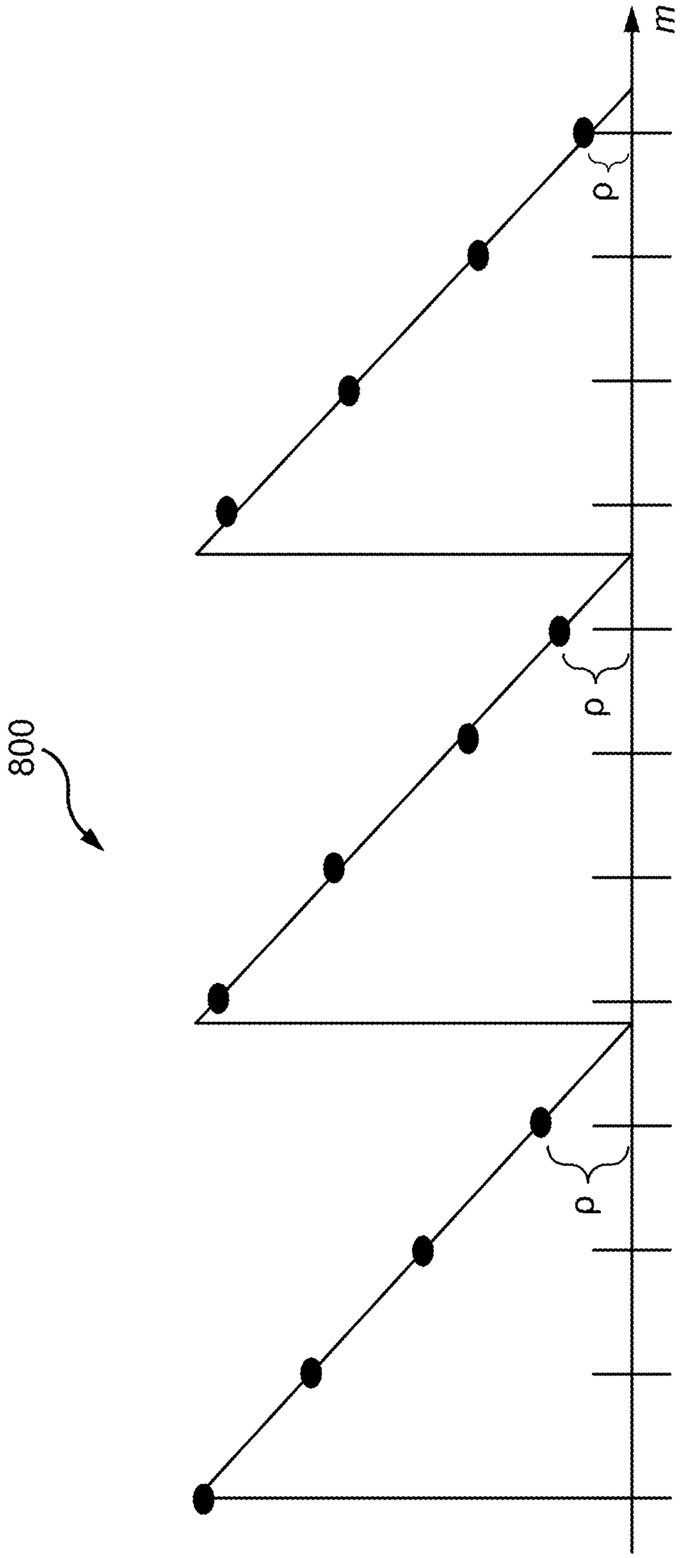
FIG. 8 depicts an example time base generation for the tracking loop depicted in FIG. 7, according to certain embodiments.

The negative slope ramp time base 712 is configured to wrap once per symbol. The value of the negative-slope ramp before the wrap is used as the input fractional time offset used by the Farrow interpolator 702. The tracking loop 700 may not involve a separate normalization factor since the equalizer performs the normalization of the signal entering the tracking loop 700. The size of the time base ramp 712 may be equal to the number of samples between two symbols. Under zero frequency offset conditions, the nominal decrement of the ramp should be equal to one. Assuming the slope of the ramp is close to one, the value of the ramp before wrapping may be used as an estimate of the fractional offset with respect to the time at wrapping, e.g., as illustrated in the time base 800 of FIG. 8.

Referring back to FIG. 6, the resampler 614 (also known as a VPI or Farrow filter) resamples the I and Q signals (e.g., changes the sample rate of the I and Q signals). The resampled I and Q signals output from the resampler 614 are phase de-rotated via the de-rotation component 620, based at least in part on phase tracking information from the phase tracking component 618. The phase tracking component 618 may use any suitable QPSK carrier phase tracking circuit, such as a phase locked loop, Costas loop, etc., to implement phase tracking. The complex QPSK signal may be restored using the delayed real component and the latest imaginary component $y_{Offset}[n]=\text{real}(y[n-1])+j\ \text{imag}(y[n])$. Here, the values of $y_{offset}$ may be input into the phase tracking component 618.

The decoder 622 performs symbol decoding of the de-rotated I/Q signals output from the de-rotation component 620. Here, as a result of the adaptation of OQPSK as a receiver for biphase signals, the decoder 622 may have an implicit rotation of 90° at every symbol time. To compensate for this implicit rotation, for each even symbol, the decoder 622 may (i) output a "1" for the symbol when the product of the latest real component and the delayed imaginary component is less than zero (e.g., $(\text{real}(y[n])*\text{imag}(y[n-1])<0)$ and may output a "0" for the symbol when the product of the latest real component and the delayed imaginary component is greater than or equal to 0. For each odd symbol, the decoder 622 may (i) output a "1" for the symbol when the product of the delayed real component and the latest imaginary component is greater than zero (e.g., $(\text{real}(y[n-1])*\text{imag}(y[n])>0)$ and may output a "0" for the symbol when the product of the delayed real component and the latest imaginary component is less than or equal to 0.

Advantageously, compared to "legacy" receivers that decode biphase signals (e.g., without converting to OQPSK), the receiver and techniques described herein for decoding biphase signals may have improved performance in terms of low BER and higher SNR, as illustrative examples.

Example Operations

Figure 9:
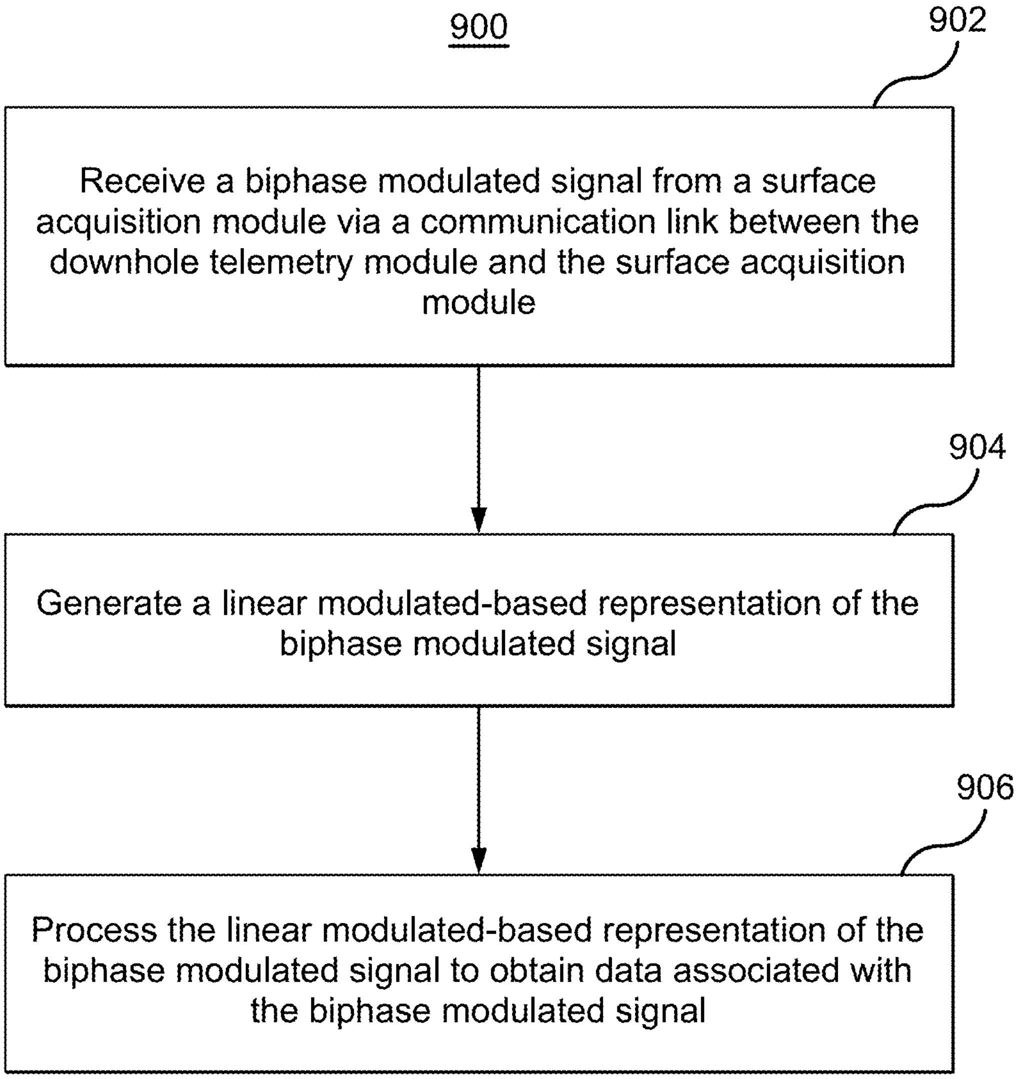
FIG. 9 is flow diagram depicting example operations for biphase signal decoding, according to certain embodiments.

FIG. 9 is a flow diagram depicting an example operations 900 for decoding of a biphase signal in wireline modem, according to various embodiments. The operations 900 may be performed, for example, by a downhole telemetry module (e.g., downhole telemetry module 110).

The operations 900 may involve, at block 902, receiving a biphase modulated signal from a surface acquisition module via a communication link between the downhole telemetry module and the surface acquisition module.

The operations 900 may also involve, at block 904, generating a linear modulated-based representation of the biphase modulated signal.

The operations 900 may further involve, at block 906, processing the linear modulated-based representation of the biphase modulated signal to obtain data associated with the biphase modulated signal In certain embodiments, generating the linear modulated-based representation of the biphase modulated signal may include representing each symbol of the linear modulated-based representation of the biphase modulated signal with a respective sinusoidal waveform, e.g., with one or more of Equations 7-10.

In certain embodiments, generating the linear modulated-based representation of the biphase modulated signal may include determining a carrier frequency for the respective sinusoidal waveform based at least in part on a duration of the symbol of the linear modulated-based representation of the biphase modulated signal (e.g., Equation 5).

In certain embodiments, generating the linear modulated-based representation of the biphase modulated signal may include determining a baseband shape of the respective sinusoidal waveform based at least in part on a duration of the symbol of the linear modulated-based representation of the biphase modulated signal (e.g., Equation 6).

In certain embodiments, generating the linear modulated-based representation of the biphase modulated signal may include assigning a polarity (e.g., positive sign or negative sign) to the respective sinusoidal waveform based at least in part on a position of the symbol relative to at least another symbol of the biphase modulated signal.

In certain embodiments, the linear modulated-based representation of the biphase modulated signal includes an in-phase (I) component and a quadrature (Q) component.

In certain embodiments, processing the linear modulated-based representation of the biphase modulated signal may include performing an adaptive linear equalization operation on the in-phase component and the quadrature component.

In certain embodiments, processing the linear modulated-based representation of the biphase modulated signal may include performing frame detection to determine a starting point of the biphase modulated signal, based at least in part on the in-phase component and the quadrature component.

In certain embodiments, processing the linear modulated-based representation of the biphase modulated signal may include performing at least one of timing synchronization or phase synchronization of the linear modulated-based representation of the biphase modulated signal.

In certain embodiments, the linear modulated-based representation of the biphase modulated signal includes an OQPSK modulated signal.

Example Computing Device

Figure 10:
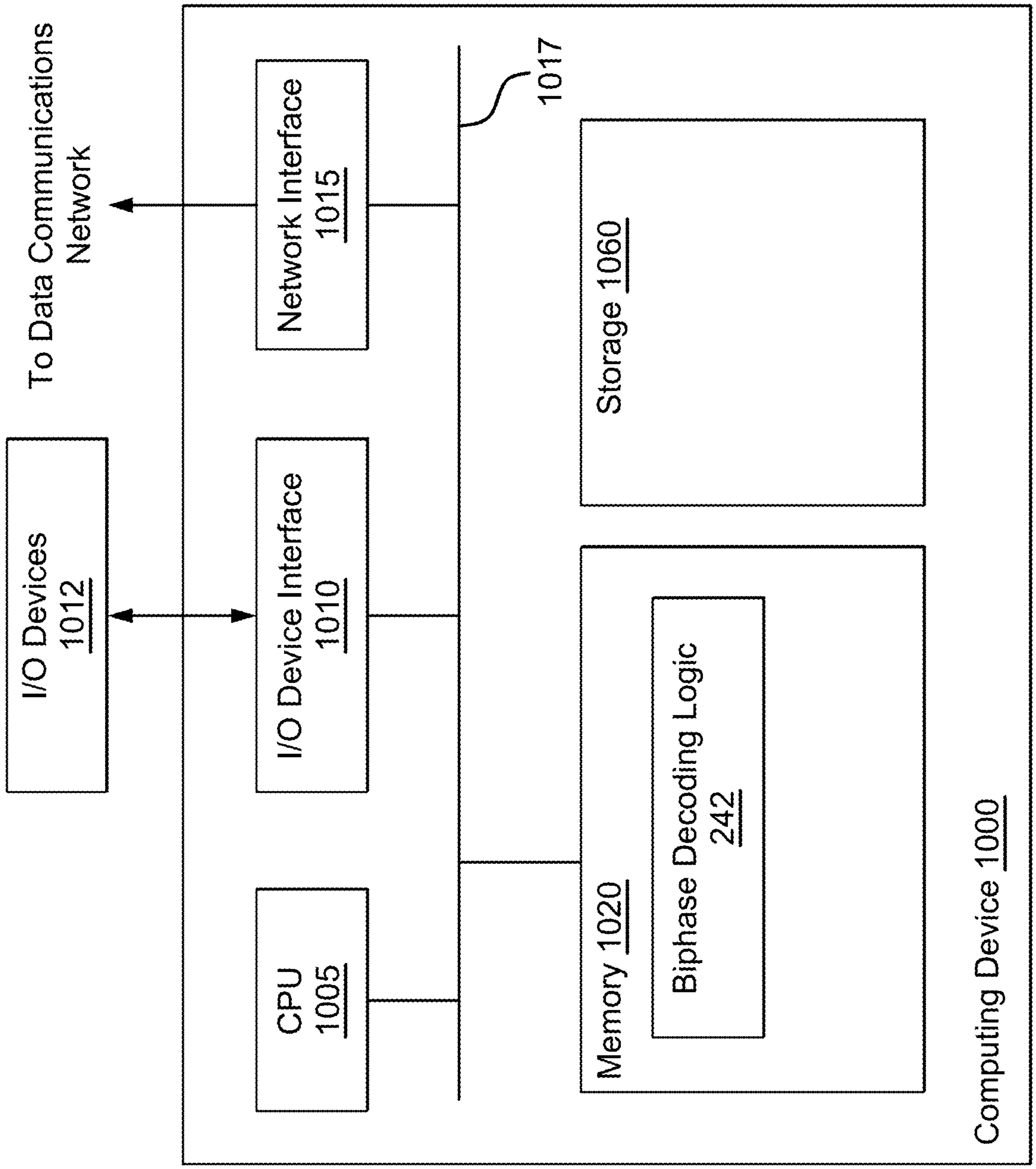
FIG. 10 depicts an example computing device, according to certain embodiments.

FIG. 10 illustrates an example computing device 1000 configured to perform decoding of a biphase signal, according to various embodiments. In certain embodiments, the computing device 1000 may be configured to perform operations 900 illustrated in FIG. 9 or any other technique or combination of techniques described herein. In certain embodiments, the computing device 1000 is representative of a downhole telemetry module (e.g., downhole telemetry module 110) or a surface acquisition module (e.g., surface acquisition module 118).

As shown, the computing device 1000 includes, without limitation, a central processing unit (CPU) 1005, a network interface 1015, a memory 1020, and storage 1060, each connected to a bus 1017. The computing device 1000 may also include an input/output (I/O) device interface 1010 connecting I/O devices 1012 (e.g., keyboard, display and mouse devices) to the computing device 1000. The computing device 1000 is generally under the control of an operating system (not shown).

The CPU 1005 retrieves and executes programming instructions stored in the memory 1020 as well as stored in the storage 1060. The bus 1017 is used to transmit programming instructions and application data between the CPU 1005, I/O device interface 1010, storage 1060, network interface 1015, and memory 1020. Note, CPU 1005 is included to be representative of a single CPU, multiple CPUs, a single CPU having multiple processing cores, and the like, and the memory 1020 is generally included to be representative of a random access memory. The storage 1060 may be a disk drive or flash storage device. Although shown as a single unit, the storage 1060 may be a combination of fixed and/or removable storage devices, such as fixed disc drives, removable memory cards, optical storage, network attached storage (NAS), or a storage area-network (SAN).

Illustratively, the memory 1020 includes biphase decoding logic 242, which is configured to perform operations 900 illustrated in FIG. 9 or any other technique (or combination of techniques) described herein. Note, while FIG. 10 depicts biphase decoding logic 242 within memory 1020, which is generally representative of volatile memory (e.g., random access memory), in certain embodiments, the biphase decoding logic 242 is included in persistent (e.g., non-volatile) memory or persistent (e.g., non-volatile) storage, such as storage 1060 of FIG. 10.

Example Clauses

Implementation examples are described in the following numbered clauses:

Clause 1: A method performed by a downhole telemetry module, the method comprising: receiving a biphase modulated signal from a surface acquisition module via a communication link between the downhole telemetry module and the surface acquisition module; generating a linear modulated-based representation of the biphase modulated signal; and processing the linear modulated-based representation of the biphase modulated signal to obtain data associated with the biphase modulated signal.

Clause 2: The method of Clause 1, wherein generating the linear modulated-based representation of the biphase modulated signal comprises representing each symbol of the linear modulated-based representation of the biphase modulated signal with a respective sinusoidal waveform.

Clause 3: The method of Clause 2, wherein generating the linear modulated-based representation of the biphase modulated signal further comprises determining a carrier frequency for the respective sinusoidal waveform based at least in part on a duration of the symbol of the linear modulated-based representation of the biphase modulated signal.

Clause 4: The method according to any of Clauses 2-3, wherein generating the linear modulated-based representation of the biphase modulated signal further comprises determining a baseband shape of the respective sinusoidal waveform based at least in part on a duration of the symbol of the linear modulated-based representation of the biphase modulated signal.

Clause 5: The method according to any of Clauses 2-4, wherein generating the linear modulated-based representation of the biphase modulated signal further comprises assigning a polarity to the respective sinusoidal waveform based at least in part on a position of the symbol relative to at least another symbol of the biphase modulated signal.

Clause 6: The method according to any of Clauses 1-5, wherein the linear modulated-based representation of the biphase modulated signal comprises an in-phase component and a quadrature component.

Clause 7: The method of Clause 6, wherein processing the linear modulated-based representation of the biphase modulated signal comprises performing an adaptive linear equalization operation on the in-phase component and the quadrature component.

Clause 8: The method according to any of Clauses 6-7, wherein processing the linear modulated-based representation of the biphase modulated signal comprises performing frame detection to determine a starting point of the biphase modulated signal, based at least in part on the in-phase component and the quadrature component.

Clause 9: The method according to any of Clauses 1-8, wherein processing the linear modulated-based representation of the biphase modulated signal comprises performing at least one of timing synchronization or phase synchronization of the linear modulated-based representation of the biphase modulated signal.

Clause 10: The method according to any of Clauses 1-9, wherein the linear modulated-based representation of the biphase modulated signal comprises an offset quadrature phase shift keying (OQPSK) modulated signal.

Clause 11: A downhole telemetry module comprising: one or more memories collectively storing instructions; and one or more processors communicatively coupled to the one or more memories, the one or more processors being collectively configured to execute the instructions to cause the downhole telemetry module to: receive a biphase modulated signal from a surface acquisition module via a communication link between the downhole telemetry module and the surface acquisition module; generate a linear modulated-based representation of the biphase modulated signal; and process the linear modulated-based representation of the biphase modulated signal to obtain data associated with the biphase modulated signal.

Clause 12: The downhole telemetry module of Clause 11, wherein to generate the linear modulated-based representation of the biphase modulated signal, the one or more processors are configured to execute the instructions to cause the downhole telemetry module to represent each symbol of the linear modulated-based representation of the biphase modulated signal with a respective sinusoidal waveform.

Clause 13: The downhole telemetry module of Clause 12, wherein to generate the linear modulated-based representation of the biphase modulated signal, the one or more processors are configured to execute the instructions to cause the downhole telemetry module to determine a carrier frequency for the respective sinusoidal waveform based at least in part on a duration of the symbol of the linear modulated-based representation of the biphase modulated signal.

Clause 14: The downhole telemetry module according to any of Clauses 12-13, wherein to generate the linear modulated-based representation of the biphase modulated signal, the one or more processors are configured to execute the instructions to cause the downhole telemetry module to determine a baseband shape of the respective sinusoidal waveform based at least in part on a duration of the symbol of the linear modulated-based representation of the biphase modulated signal.

Clause 15: The downhole telemetry module according to any of Clauses 12-14, wherein to generate the linear modulated-based representation of the biphase modulated signal, the one or more processors are further configured to execute the instructions to cause the downhole telemetry module to assign a polarity to the respective sinusoidal waveform based at least in part on a position of the symbol relative to at least another symbol of the biphase modulated signal.

Clause 16: The downhole telemetry module according to any of Clauses 11-15, wherein the linear modulated-based representation of the biphase modulated signal comprises an in-phase component and a quadrature component.

Clause 17: The downhole telemetry module of Clause 16, wherein to process the linear modulated-based representation of the biphase modulated signal, the one or more processors are configured to execute the instructions to cause the downhole telemetry module to perform an adaptive linear equalization operation on the in-phase component and the quadrature component.

Clause 18: The downhole telemetry module according to any of Clauses 16-17, wherein to process the linear modulated-based representation of the biphase modulated signal, the one or more processors are configured to execute the instructions to cause the downhole telemetry module to perform frame detection to determine a starting point of the biphase modulated signal, based at least in part on the in-phase component and the quadrature component.

Clause 19: The downhole telemetry module according to any of Clauses 11-18, wherein to process the linear modulated-based representation of the biphase modulated signal, the one or more processors are configured to execute the instructions to cause the downhole telemetry module to perform at least one of timing synchronization or phase synchronization of the linear modulated-based representation of the biphase modulated signal.

Clause 20: A non-transitory computer-readable storage medium comprising computer-executable code, which when executed by one or more processors of a downhole telemetry module, perform an operation comprising: receiving a biphase modulated signal from a surface acquisition module via a communication link between the downhole telemetry module and the surface acquisition module; generating a linear modulated-based representation of the biphase modulated signal; and processing the linear modulated-based representation of the biphase modulated signal to obtain data associated with the biphase modulated signal.

Clause 21: A downhole telemetry module comprising: one or more memories collectively storing executable instructions; and one or more processors coupled to the one or more memories, the one or more processors being collectively configured to execute the executable instructions and cause the downhole telemetry module to perform a method in accordance with any of Clauses 1-10.

Clause 22: A non-transitory computer-readable medium comprising computer-executable instructions that, when executed by one or more processors of a surface acquisition module, cause the surface acquisition module to perform a method in accordance with any of Clauses 1-10.

Clause 23: An apparatus comprising means for performing a method in accordance with any of Clauses 1-10.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, "a processor," "at least one processor," or "one or more processors" generally refer to a single processor configured to perform one or multiple operations or multiple processors configured to collectively perform one or more operations. In the case of multiple processors, performance of the one or more operations could be divided amongst different processors, though one processor may perform multiple operations, and multiple processors could collectively perform a single operation. Similarly, "a memory," "at least one memory," or "one or more memories" generally refer to a single memory configured to store data and/or instructions or multiple memories configured to collectively store data and/or instructions.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an ASIC, or processor.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for". All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The invention claimed is:

1. A method performed by a downhole telemetry module, the method comprising:
- receiving a biphase modulated signal from a surface acquisition module via a communication link between the downhole telemetry module and the surface acquisition module;
- generating a linear modulated-based representation of the biphase modulated signal; and
- processing the linear modulated-based representation of the biphase modulated signal to obtain data associated with the biphase modulated signal.

2. The method of claim 1, wherein generating the linear modulated-based representation of the biphase modulated signal comprises representing each symbol of the linear modulated-based representation of the biphase modulated signal with a respective sinusoidal waveform.

3. The method of claim 2, wherein generating the linear modulated-based representation of the biphase modulated signal further comprises determining a carrier frequency for the respective sinusoidal waveform of each symbol based at least in part on a duration of the symbol.

4. The method of claim 2, wherein generating the linear modulated-based representation of the biphase modulated signal further comprises determining a baseband shape of the respective sinusoidal waveform of each symbol based at least in part on a duration of the symbol.

5. The method of claim 2, wherein generating the linear modulated-based representation of the biphase modulated signal further comprises assigning a polarity to the respective sinusoidal waveform of each symbol based at least in part on a position of the symbol relative to at least another symbol of the biphase modulated signal.

6. The method of claim 1, wherein the linear modulated-based representation of the biphase modulated signal comprises an in-phase component and a quadrature component.

7. The method of claim 6, wherein processing the linear modulated-based representation of the biphase modulated signal comprises performing an adaptive linear equalization operation on the in-phase component and the quadrature component.

8. The method of claim 6, wherein processing the linear modulated-based representation of the biphase modulated signal comprises performing frame detection to determine a starting point of the biphase modulated signal, based at least in part on the in-phase component and the quadrature component.

9. The method of claim 1, wherein processing the linear modulated-based representation of the biphase modulated signal comprises performing at least one of timing synchronization or phase synchronization of the linear modulated-based representation of the biphase modulated signal.

10. The method of claim 1, wherein the linear modulated-based representation of the biphase modulated signal comprises an offset quadrature phase shift keying (OQPSK) modulated signal.

11. A downhole telemetry module comprising:
one or more memories collectively storing instructions; and
one or more processors communicatively coupled to the one or more memories, the one or more processors being collectively configured to execute the instructions to cause the downhole telemetry module to:
receive a biphase modulated signal from a surface acquisition module via a communication link between the downhole telemetry module and the surface acquisition module;
generate a linear modulated-based representation of the biphase modulated signal; and
process the linear modulated-based representation of the biphase modulated signal to obtain data associated with the biphase modulated signal.

12. The downhole telemetry module of claim 11, wherein to generate the linear modulated-based representation of the biphase modulated signal, the one or more processors are configured to execute the instructions to cause the downhole telemetry module to represent each symbol of the linear modulated-based representation of the biphase modulated signal with a respective sinusoidal waveform.

13. The downhole telemetry module of claim 12, wherein to generate the linear modulated-based representation of the biphase modulated signal, the one or more processors are configured to execute the instructions to cause the downhole telemetry module to determine a carrier frequency for the respective sinusoidal waveform of each symbol based at least in part on a duration of the symbol.

14. The downhole telemetry module of claim 12, wherein to generate the linear modulated-based representation of the biphase modulated signal, the one or more processors are configured to execute the instructions to cause the downhole telemetry module to determine a baseband shape of the respective sinusoidal waveform of each symbol based at least in part on a duration of the symbol.

15. The downhole telemetry module of claim 12, wherein to generate the linear modulated-based representation of the biphase modulated signal, the one or more processors are further configured to execute the instructions to cause the downhole telemetry module to assign a polarity to the respective sinusoidal waveform of each symbol based at least in part on a position of the symbol relative to at least another symbol of the biphase modulated signal.

16. The downhole telemetry module of claim 11, wherein the linear modulated-based representation of the biphase modulated signal comprises an in-phase component and a quadrature component.

17. The downhole telemetry module of claim 16, wherein to process the linear modulated-based representation of the biphase modulated signal, the one or more processors are configured to execute the instructions to cause the downhole telemetry module to perform an adaptive linear equalization operation on the in-phase component and the quadrature component.

18. The downhole telemetry module of claim 16, wherein to process the linear modulated-based representation of the biphase modulated signal, the one or more processors are configured to execute the instructions to cause the downhole telemetry module to perform frame detection to determine a starting point of the biphase modulated signal, based at least in part on the in-phase component and the quadrature component.

19. The downhole telemetry module of claim 11, wherein to process the linear modulated-based representation of the biphase modulated signal, the one or more processors are configured to execute the instructions to cause the downhole telemetry module to perform at least one of timing synchronization or phase synchronization of the linear modulated-based representation of the biphase modulated signal.

20. A non-transitory computer-readable storage medium comprising computer-executable code, which when executed by one or more processors of a downhole telemetry module, perform an operation comprising:
receiving a biphase modulated signal from a surface acquisition module via a communication link between the downhole telemetry module and the surface acquisition module;
generating a linear modulated-based representation of the biphase modulated signal; and
processing the linear modulated-based representation of the biphase modulated signal to obtain data associated with the biphase modulated signal.

* * * * *